US011675269B2

(12) United States Patent
Sakamoto et al.

(10) Patent No.: US 11,675,269 B2
(45) Date of Patent: Jun. 13, 2023

(54) COMPOSITION FOR FORMING RESIST OVERLAYER FILM FOR EUV LITHOGRAPHY

(75) Inventors: Rikimaru Sakamoto, Toyama (JP); Bangching Ho, Toyama (JP); Takafumi Endo, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/880,470

(22) PCT Filed: Sep. 15, 2011

(86) PCT No.: PCT/JP2011/071139
§ 371 (c)(1),
(2), (4) Date: Apr. 19, 2013

(87) PCT Pub. No.: WO2012/053302
PCT Pub. Date: Apr. 26, 2012

(65) Prior Publication Data
US 2013/0209940 A1    Aug. 15, 2013

(30) Foreign Application Priority Data
Oct. 21, 2010    (JP) .............................. JP2010-236121

(51) Int. Cl.
*G03F 7/11*    (2006.01)
*C08L 61/06*    (2006.01)
(Continued)

(52) U.S. Cl.
CPC .................. *G03F 7/11* (2013.01); *C08G 8/08* (2013.01); *C08G 8/24* (2013.01); *C08L 61/06* (2013.01);
(Continued)

(58) Field of Classification Search
None
See application file for complete search history.

(56) References Cited

U.S. PATENT DOCUMENTS

2002/0076642 A1* 6/2002 Zampini et al. ........... 430/270.1
2005/0267277 A1* 12/2005 Takahama ............ C09D 183/04
528/38
(Continued)

FOREIGN PATENT DOCUMENTS

CN    101467100 A    6/2009
JP    2004-348133    12/2004
(Continued)

OTHER PUBLICATIONS

Machine translation JP 2008-242303. Oct. 9, 2008.*
(Continued)

*Primary Examiner* — Cynthia H Kelly
*Assistant Examiner* — Alyssa L Cepluch
(74) *Attorney, Agent, or Firm* — Oliff PLC

(57) ABSTRACT

There is provided a composition for forming an EUV resist overlayer film that is used in an EUV lithography process, that does not intermix with the EUV resist, that blocks unfavorable exposure light for EUV exposure, for example, UV light and DUV light and selectively transmits EUV light alone, and that can be developed with a developer after exposure. A composition for forming an EUV resist overlayer film used in an EUV lithography process including a resin containing a naphthalene ring in a main chain or in a side chain and a solvent, in which the resin may include a hydroxy group, a carboxy group, a sulfo group, or a monovalent organic group having at least one of these groups as a hydrophilic group.

13 Claims, 1 Drawing Sheet

(51) Int. Cl.
    *C08G 8/08*           (2006.01)
    *C09D 161/06*       (2006.01)
    *G03F 7/09*           (2006.01)
    *C08G 8/24*           (2006.01)
    *C09D 5/00*           (2006.01)
    *C08F 12/24*           (2006.01)
    *C08F 212/14*         (2006.01)

(52) U.S. Cl.
    CPC ............ *C09D 5/00* (2013.01); *C09D 161/06* (2013.01); *G03F 7/091* (2013.01); *C08F 12/24* (2013.01); *C08F 212/24* (2020.02)

(56) References Cited

U.S. PATENT DOCUMENTS

| | | | | |
|---|---|---|---|---|
| 2007/0231713 A1* | 10/2007 | Bristol | .................... | G03F 7/091 430/5 |
| 2009/0053647 A1* | 2/2009 | Enomoto et al. | .......... | 430/271.1 |
| 2009/0087799 A1* | 4/2009 | Tachibana et al. | ........... | 430/323 |
| 2009/0311622 A1 | 12/2009 | Sugita et al. | | |
| 2010/0055626 A1 | 3/2010 | Endou et al. | | |

FOREIGN PATENT DOCUMENTS

| | | |
|---|---|---|
| JP | 2008-46206 | 2/2008 |
| JP | 2008-65304 | 3/2008 |
| JP | 2008-198788 | 8/2008 |
| JP | 2008242303 A * | 10/2008 |
| JP | 2009-164441 | 7/2009 |
| JP | 2010-160283 | 7/2010 |
| WO | WO 2008/015969 A1 | 2/2008 |

OTHER PUBLICATIONS

JP 2008-065304 machine translation. Retrieved Nov. 5, 2014. (Year: 2008).*
Dattoli et al. "Extreme ultraviolet (EUV) sources for lithography based on synchrotron radiation" Nuclear Instruments and Methods in Physics Research A 474 (2001) 259-272 (Year: 2001).*
Jul. 15, 2014 Office Action issued in Chinese Application No. 201180050223.3 (with translation).
International Search Report issued in International Application No. PCT/JP2011/071139 dated Dec. 6, 2011 (with translation).
Written Opinion of the International Searching Authority issued in International Application No. PCT/JP2011/071139 dated Dec. 6, 2011 (with translation).

* cited by examiner

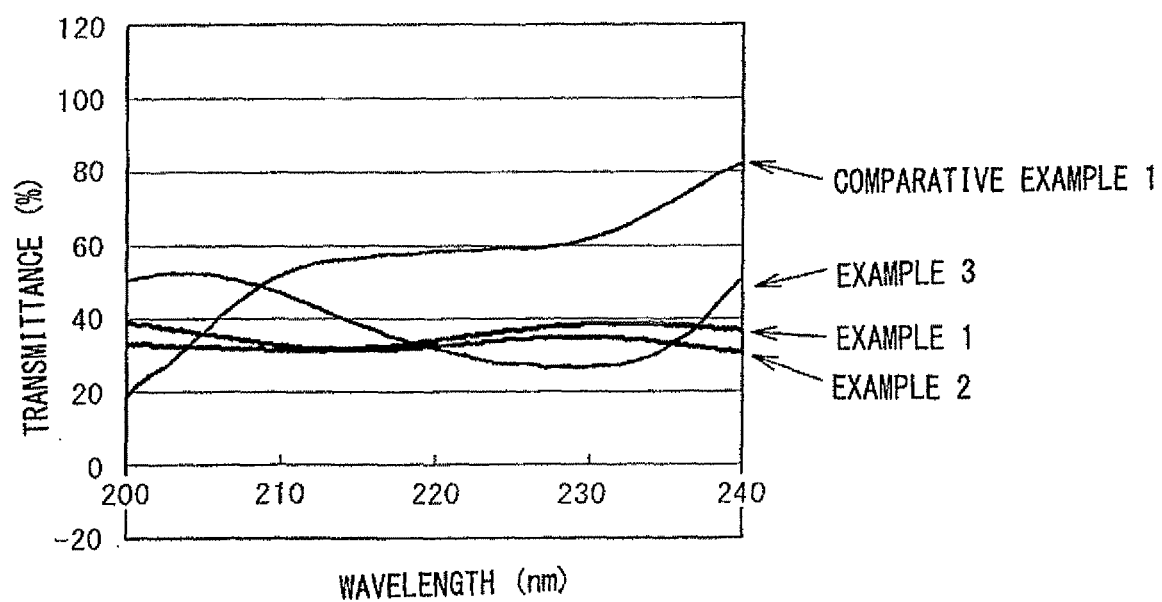

COMPOSITION FOR FORMING RESIST OVERLAYER FILM FOR EUV LITHOGRAPHY

TECHNICAL FIELD

The present invention relates to a composition that is for forming a resist overlayer film for EUV lithography, that reduces adverse effects caused by EUV used in a device fabrication process employing EUV lithography, and that is effective for affording a good resist pattern, and a method for producing a semiconductor using the composition for forming a resist overlayer film for EUV lithography.

BACKGROUND ART

Conventionally, microfabrication has been carried out employing photolithography techniques in the production of semiconductor devices. The microfabrication is a machining process in which a thin film of a photoresist composition is formed on a substrate to be fabricated, such as a silicon wafer, active light such as ultraviolet light is applied onto the film through a mask pattern with a pattern of a semiconductor device followed by development, and the substrate to be fabricated, such as a silicon wafer is etched using the obtained photoresist pattern as a protective film. In recent years, semiconductor devices have been further integrated, and the active light to be used has been changed from a KrF excimer laser (248 nm) to an ArF excimer laser (193 nm) that has a shorter wavelength. Such a change raises serious problems due to the effects of irregular reflections of active light from a substrate and standing waves. To address this, an anti-reflective coating (Bottom Anti-Reflective Coating, BARC) has been widely adopted between the photoresist and the substrate to be fabricated as a resist underlayer film in order to suppress the reflections.

Known examples of the anti-reflective coating include an inorganic anti-reflective coating including, for example, titanium, titanium dioxide, titanium nitride, chromium oxide, carbon, and α-silicon and an organic anti-reflective coating including a light absorbing substance and a polymer compound. The former requires, for the film formation, an apparatus such as a vacuum deposition system, a CVD system, and a sputtering system, whereas the latter requires no special system. Such an advantage leads to a large number of studies on the organic anti-reflective coating.

In recent years, as a next-generation photolithography technique subsequent to the photolithography technique using the ArF excimer laser (193 nm), an ArF immersion lithography technique in which exposure is performed through water has been actively studied. However, the photolithography technique using light has been reaching the limit and a lithography technique using EUV (having a wavelength of 13.5 nm, extreme ultraviolet) light has been drawing attention as a new lithography technique subsequent to the ArF immersion lithography technique.

In the device fabrication process employing EUV lithography, a substrate coated with an EUV resist is irradiated with EUV light to be exposed followed by development and a resist pattern is formed. At this time, in order to protect the EUV resist from a contaminant or to shield the EUV resist from unfavorable radiation rays, for example, UV light or deep ultraviolet (DUV) light, a method of applying, onto an EUV resist, a polymer including a group containing at least one selected from the group consisting of beryllium, boron, carbon, silicon, zirconium, niobium, and molybdenum is disclosed (Patent Document 1, Patent Document 2).

PRIOR ART DOCUMENTS

Patent Documents

Patent Document 1: Japanese Patent Application Publication No. 2004-348133 (JP 2004-348133 A)
Patent Document 2: Japanese Patent Application Publication No. 2008-198788 (JP 2008-198788 A)

SUMMARY OF THE INVENTION

Problem to be Solved by the Invention

The present invention provides, for an overlayer film on an EUV resist, a composition for forming an EUV resist overlayer film that is used in an EUV lithography process, that does not intermix with the EUV resist, that blocks unfavorable exposure light for EUV exposure, for example, UV light and DUV light and selectively transmits EUV light alone, and that can be developed with a developer after exposure.

Means for Solving the Problem

The present invention relates to, as a first aspect, a composition for forming an EUV resist overlayer film used in an EUV lithography process. The composition includes a resin containing a naphthalene ring in a main chain or in a side chain and a solvent.

The present invention relates to, as a second aspect, the composition for forming an EUV resist overlayer film according to the first aspect, in which the resin includes a hydroxy group, a carboxy group, a sulfo group, or a monovalent organic group having at least one of these groups as a hydrophilic group.

The present invention relates to, as a third aspect, the composition for forming an EUV resist overlayer film according to the first aspect or the second aspect, in which the resin includes a unit structure of Formula (1) or unit structures of Formula (1) and Formula (2):

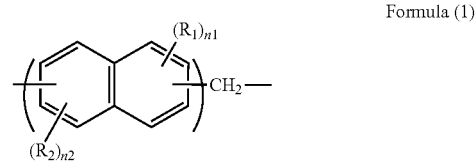

Formula (1)

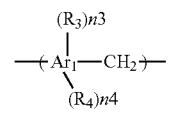 

Formula (2)

(in Formulae, each of $R_1$ and $R_3$ is independently a hydroxy group, a carboxy group, a sulfo group, or a monovalent organic group having at least one of these groups; each of $R_2$ and $R_4$ is independently a $C_{1-10}$ alkyl group, a $C_{2-10}$ alkenyl group, a benzyl group, a phenyl group, a halogen atom, a $C_{1-10}$ alkoxy group, a nitro group, a cyano group, a $C_{1-10}$ alkylthio group, or a combination of two or more of them; $Ar_1$ is a benzene ring or an anthracene ring; each of n1 and n2 is an integer of 0 to 6; each of n3 and n4 is an integer of 0 to a maximum number of substituents capable of being present on the benzene ring or the anthracene ring; and (n1) or (n1+n3) is at least 1).

The present invention relates to, as a fourth aspect, the composition for forming an EUV resist overlayer film according to the first aspect or the second aspect, in which the resin includes a unit structure of Formula (3), unit structures of Formula (3) and Formula (4), unit structures of Formula (3) and Formula (5), unit structures of Formula (3), Formula (4), and Formula (5), unit structures of Formula (3), Formula (5), and Formula (6), or unit structures of Formula (3), Formula (4), Formula (5), and Formula (6):

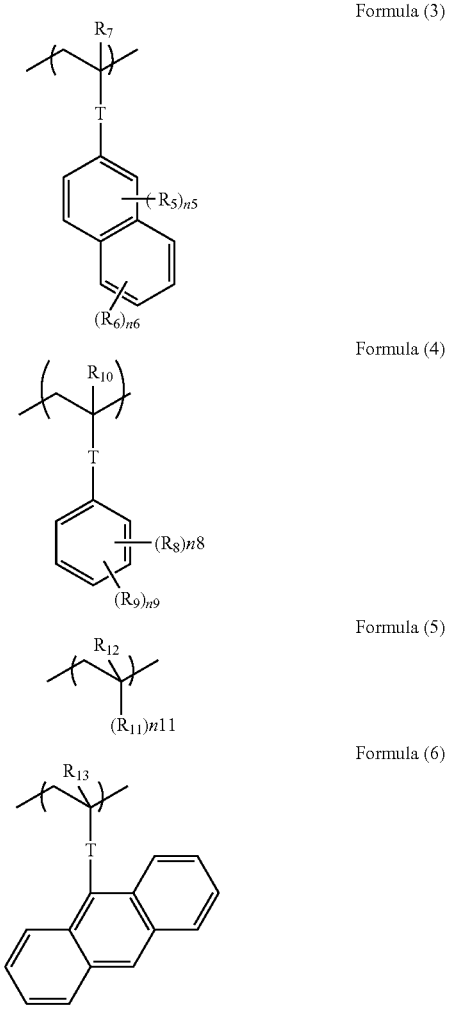

(in Formulae, T is a single bond, an ether group, an ester group, a carbonyl group, an amido group, or a divalent organic group having at least one of these groups; each of $R_7$, $R_{10}$, $R_{12}$, and $R_{13}$ is independently a hydrogen atom or a methyl group; each of $R_5$, $R_8$, and $R_{11}$ is independently a hydroxy group, a carboxy group, a sulfa group, or a monovalent organic group having at least one of these groups; each of $R_6$ and $R_9$ is independently a $C_{1-10}$ alkyl group, a $C_{2-40}$ alkenyl group, a benzyl group, a phenyl group, a halogen atom, a $C_{1-10}$ alkoxy group, a nitro group, a cyano group, a $C_{1-10}$ alkylthio group, or a combination of two or more of them; each of n5 and n6 is an integer of 0 to 7; each of n8 and n9 is an integer of 0 to 5; and (n5), (n5+n8), (n5+n11), or (n5+n8+n11) is at least 1).

The present invention relates to, as a fifth aspect, the composition for forming an EUV resist overlayer film according to any one of the first aspect to the fourth aspect, in which the solvent is an alcoholic solvent.

The present invention relates to, as a sixth aspect, the composition for forming an EUV resist overlayer film according to any one of the first aspect to the fifth aspect, the composition further including an acid compound.

The present invention relates to, as a seventh aspect, the composition for forming an EUV resist overlayer film according to the sixth aspect, in which the acid compound is a sulfonic acid compound or a sulfonate ester compound.

The present invention relates to, as an eighth aspect, the composition for forming an EUV resist overlayer film according to the sixth aspect, in which the acid compound is an iodonium salt based acid generator or a sulfonium salt based acid generator.

The present invention relates to, as a ninth aspect, a method for producing a semiconductor device. The method includes forming an EUV resist film on a substrate, applying the composition for forming an EUV resist overlayer film according to any one of claims 1 to claim 8 onto the resist film and baking the composition to form an EUV resist overlayer film, exposing the semiconductor substrate coated with the resist overlayer film and the resist film, and developing the substrate after the exposure to remove the resist overlayer film and the resist film.

The present invention relates to, as a tenth aspect, the method for producing a semiconductor device according to the ninth aspect, in which the exposing is carried out with EUV (having a wavelength of 13.5 nm) light.

Effects of the Invention

The present invention can provide, for an overlayer film on an EUV resist, a composition for forming an EUV resist overlayer film, and the composition can form an EUV resist overlayer film that does not intermix with the EUV resist, that blocks unfavorable exposure light for EUV exposure, for example, out-of-BAND radiations such as UV light and DUV light and selectively transmits EUV light alone, and that can be developed with a developer after exposure.

In particular, the composition for forming an EUV resist overlayer film of the present invention can provide a resist overlayer film capable of absorbing DUV light having a wavelength of 200 to 240 nm that is considered to be the most unfavorable among the out-of-BAND radiations included in EUV exposure light, thereby improving the resolution of the EUV resist.

In addition, the composition for forming an EUV resist overlayer film of the present invention does not cause intermixing with the EUV resist formed underneath when the composition is applied to the production of a semiconductor device, and can be removed together with the EUV resist using a developer after EUV exposure.

BRIEF DESCRIPTION OF THE DRAWINGS

FIG. 1 is a view showing a graph of transmittance in a wavelength range from 200 nm to 240 nm of a resist overlayer film formed using each composition (solution) for forming a resist overlayer film obtained in Example 1 to Example 3 and Comparative Example 1, measured with a spectrophotometer.

MODES FOR CARRYING OUT THE INVENTION

The present invention intends to provide a composition suitable for forming an EUV resist overlayer film used in an EUV lithography process.

As described above, in the device fabrication process employing EUV lithography, a substrate coated with an EUV resist is irradiated with EUV light to be exposed. During the exposure of an EUV resist, the EUV light may contain light having a wavelength of 300 nm or less (that is, UV light and DUV light) in an amount of about 5% in addition to the EUV light. Such light, for example, the light having a wavelength of around 190 to 300 nm, 190 to 250 nm, or especially 200 to 240 nm leads to the reduction in sensitivity of an EUV resist or the deterioration of a pattern shape. In particular, a pattern shape having a line width of 22 nm or less begins to be affected by out-of-BAND radiations such as the UV light and DUV light, which adversely affects the resolution of an EUV resist. In order to remove such unfavorable light having a wavelength of around 200 to 240 nm, a method of installing a filter in a lithography system may be employed, but the method raises a problem of a complicated process.

Meanwhile, in order to suppress the intermixing of an EUV resist film and an EUV resist overlayer film (mixing of layers) when the EUV resist overlayer film is applied onto the EUV resist, instead of a solvent that is used in the EUV resist, an alcoholic solvent, for example may be used as a solvent used for forming the EUV resist overlayer film. In such a case, an EUV resist overlayer film material is required to have high solubility in the alcoholic solvent.

In view of the above circumstances, the inventors of the present invention have completed a composition that is for forming an EUV resist overlayer film, that suppresses the effect of out-of-BAND radiations, and that has high solubility with respect to an alcoholic solvent, by selecting a polymer containing a naphthalene ring that selectively and efficiently absorbs DUV light having a wavelength of around 200 to 240 nm as the polymer used for an EUV resist overlayer film and by making the polymer contain a hydrophilic group including a hydroxy group, a carboxy group, a sulfa group, and an organic group having these groups in order to increase the solubility of the polymer in an alcoholic solvent.

An EUV resist overlayer film formed from the composition of the present invention can be dissolved in an developer (for example, an alkaline developer) because the polymer as the material has a hydrophilic group including a hydroxy group, a carboxy group, a sulfa group, and an organic group having these groups. This enables the EUV resist overlayer film to be dissolved and removed together with the EUV resist with a developer during development after exposure.

The present invention will now be described in detail.

The present invention is a composition that is for forming an EUV resist overlayer film used in an EUV lithography process and that includes a resin containing a naphthalene ring in the main chain or in a side chain.

The composition for forming an EUV resist overlayer film includes a resin containing a naphthalene ring and a solvent and may further include a cross-linking agent, a cross-linking catalyst, and a surfactant.

The composition for forming an EUV resist overlayer film of the present invention has a solid content of 0.1 to 50% by mass and preferably 0.5 to 30% by mass. The solid content is a content of the composition for forming an EUV resist overlayer film except the solvent component.

The resin is contained in the composition for forming an EUV resist overlayer film in an amount of 20% by mass or more, for example, 20 to 100% by mass, 30 to 100% by mass, 50 to 90% by mass, or 60 to 80% by mass, in the solid content.

The resin may include, as a hydrophilic group, a hydroxy group, a carboxy group, a sulfo group, or a monovalent organic group having at least one of these groups.

The resin may be a resin including the structural unit of Formula (1) or a resin including both the structural unit of Formula (1) and the unit structure of Formula (2).

In Formula (1) and Formula (2), each of $R_1$ and $R_3$ is independently a hydroxy group, a carboxy group, a sulfo group, or a monovalent organic group having at least one of these groups; and each of $R_2$ and $R_4$ is independently a $C_{1-10}$ alkyl group, a $C_{2-10}$ alkenyl group, a benzyl group, a phenyl group, a halogen atom, a $C_{1-10}$ alkoxy group, a nitro group, a cyano group, a $C_{1-10}$ alkylthio group, or a combination of two or more of them.

$Ar_1$ is a benzene ring or an anthracene ring.

Each of n1 and n2 is an integer of 0 to 6; and each of n3 and n4 is an integer of 0 to a maximum number of substituents capable of being present on the benzene ring or the anthracene ring (benzene ring: 4, anthracene ring: 8). Here, (n1) or (n1+n3) is at least 1. The at least 1 may be, for example, 1, 2, 3, or 4.

When n1, n2, n3, and n4 each are an integer of 2 or more, corresponding $R_1$, $R_2$, $R_3$, and $R_4$ may be the same group or may be different groups to each other.

Alternatively, the resin may be a resin including the structural unit of Formula (3), a resin including two structural units of the structural unit of Formula (3) and the structural unit of Formula (4), a resin including two structural units of the structural unit of Formula (3) and the structural unit of Formula (5), a resin including three structural units of the structural unit of Formula (3), the structural unit of Formula (4), and the structural unit of Formula (5), a resin including three structural units of the structural unit of Formula (3), the structural unit of Formula (5), and the structural unit of Formula (6), or a resin including four unit structures of the structural unit of Formula (3), the structural unit of Formula (4), the structural unit of Formula (5), and the structural unit of Formula (6).

In Formula (3) to Formula (6), each of $R_7$, $R_{10}$, $R_{12}$, and $R_{13}$ is independently a hydrogen atom or a methyl group; each of $R_5$, $R_9$, and $R_{11}$ is independently a hydroxy group, a carboxy group, a sulfo group, or a monovalent organic group having at least one of these groups; and each of $R_6$ and $R_9$ is independently a $C_{1-10}$ alkyl group, a $C_{2-10}$ alkenyl group, a benzyl group, a phenyl group, a halogen atom, a $C_{1-10}$ alkoxy group, a nitro group, a cyano group, a $C_{1-10}$ alkylthio group, or a combination of two or more of them.

Each of n5 and n6 is an integer of 0 to 7; and each of n8 and n9 is an integer of 0 to 5. Here, (n5), (n5+n8), (n5+n11), or (n5+n8+n11) is at least 1. The at least 1 may be, for example, 1, 2, 3, or 4.

When n5, n6, n7, and n8 each are an integer of 2 or more, corresponding $R_5$, $R_6$, $R_7$, and $R_8$ may be the same group or may be different groups to each other.

T is a single bond, an ether group (—O—), an ester group (—(CO)O—), a carbonyl group (—(CO)—), or an amido group (—(CO)—(NH)—) or is a divalent organic group having at least one of these groups.

The divalent organic group in T is a divalent organic group that is derived from, for example, a $C_{1-10}$ alkyl group or a $C_{2-10}$ alkenyl group exemplified below, or a phenyl group and that has at least one of the ether group, the ester group, the carbonyl group, and the amido group.

The monovalent organic group in $R_1$ and $R_3$ is a monovalent organic group that is, for example, a $C_{1-10}$ alkyl group or a $C_{2-10}$ alkenyl group exemplified below, or a phenyl group and that includes a hydroxy group, a carboxy group, a sulfa group, or a monovalent organic group having at least one of these groups.

The monovalent organic group in $R_5$, $R_8$, and $R_{11}$ is a monovalent organic group that is a $C_{1-10}$ alkyl group or a $C_{2-10}$ alkenyl group exemplified below, or a phenyl group and that includes a hydroxy group, a carboxy group, a sulfa group, or a monovalent organic group having at least one of these groups.

Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{2-10}$ alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the $C_{1-10}$ alkoxy group include a methoxy group, an ethoxy group, an n-propoxy group, an i-propoxy group, an n-butoxy group, an i-butoxy group, an s-butoxy group, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

Examples of the $C_{1-10}$ alkylthio group include an ethylthio group, a butylthio group, a hexylthio group, and an octylthio group.

Examples of the halogen atom include a fluorine atom, a chlorine atom, a bromine atom, and an iodine atom.

The resin used in the composition for forming an EUV resist overlayer film of the present invention has a weight average molecular weight of 500 to 1,000,000, preferably 700 to 500,000, more preferably 1,000 to 300,000, and even more preferably 1,000 to 100,000.

As the resin, for example, a resin including unit structures of Formula (7-1) to Formula (7-5) exemplified below (a resin containing a naphthalene ring in the main chain) or a resin including unit structures of Formula (8-1) to Formula (8-7) exemplified below (a resin containing a naphthalene ring in a side chain) can be used.
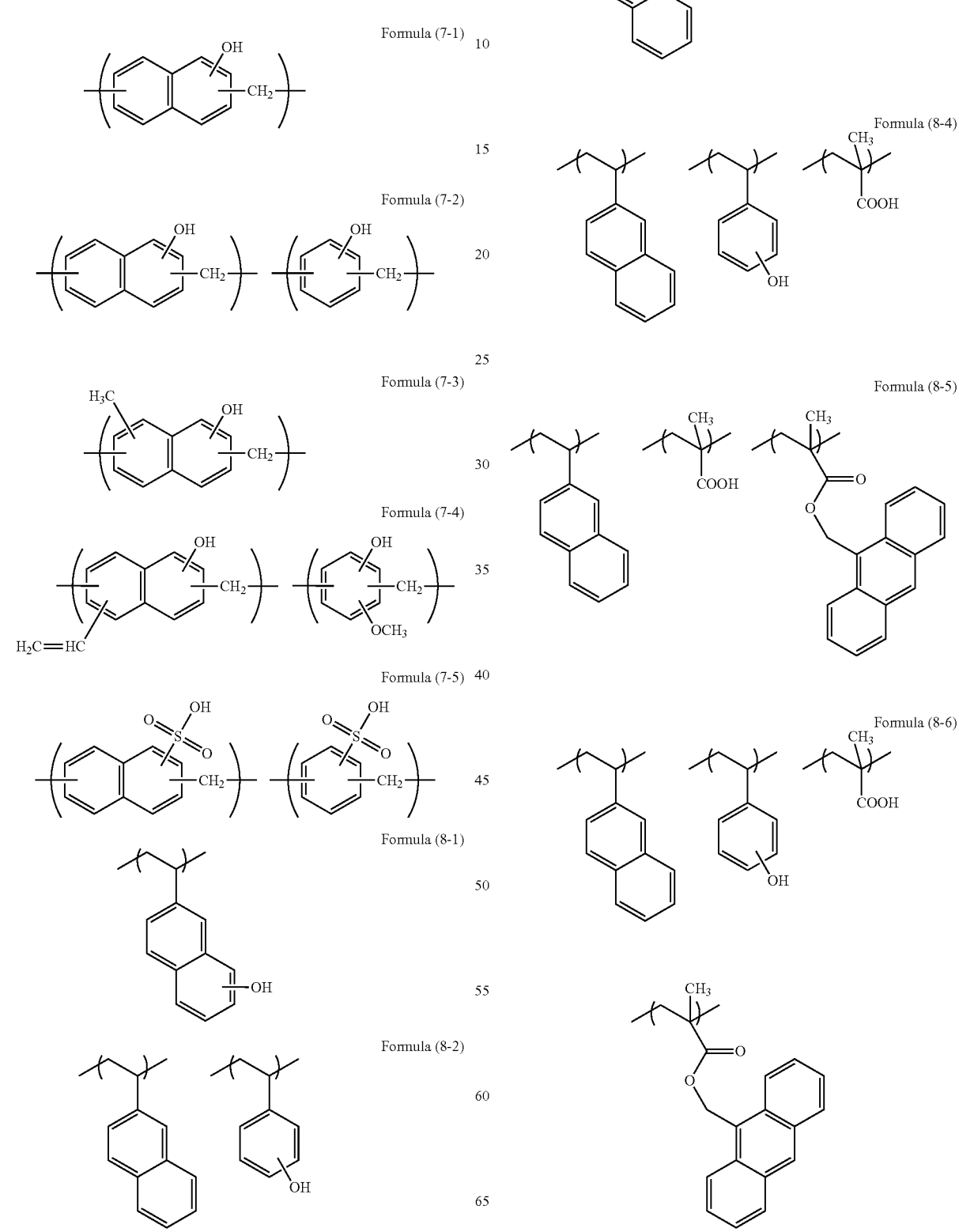

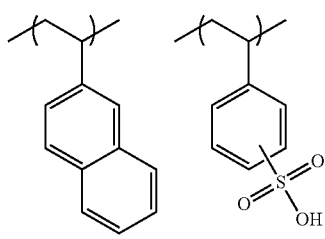

Formula (8-7)

As the solvent contained in the composition for forming an EUV resist overlayer film of the present invention, an alcoholic solvent can be preferably used. Examples of these alcoholic solvents include 1-butanol, 2-butanol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1 pentanol, 4-methyl-2-pentanol, 4-methyl-3-pentanol, and cyclohexanol. These alcoholic solvents can be used singly or as a mixture.

Additional solvents below can be used in combination with the alcoholic solvents above. Examples of the additional solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more of them.

Such an additional solvent may be contained in a ratio of 0.01 to 10.00% by mass with respect to the alcoholic solvent.

The composition for forming an EUV resist overlayer film of the present invention may further include an acid compound in order to match the acidity to that of a resist present underneath in a lithography process.

As the acid compound, for example, a sulfonic acid compound or a sulfonate ester compound can be suitably used.

Examples of the sulfonic acid and the sulfonate ester compound include acidic compounds such as p-toluenesulfonic acid, trifluoromethanesulfonic acid, pyridinium p-toluenesulfonate, and sulfosalicylic acid and/or thermal acid generators such as benzoin tosylate and 2-nitrobenzyl tosylate. Salicylic acid, citric acid, benzoic acid, hydroxybenzoic acid, 2,4,4,6-tetrabromocyclohexadienone, and other compounds may also be used.

The composition for forming an EUV resist overlayer film of the present invention may contain, as the acid compound, an acid generator that generates an acid by EUV irradiation in order to match the acidity to that of a resist present underneath in a lithography process.

Preferred examples of the acid generator include onium salt based acid generators (for example, an iodonium salt based acid generator and a sulfonium salt based acid generator) including bis(4-tert-butylphenyl)iodonium trifluoromethanesulfonate and triphenylsulfonium trifluoromethanesulfonate; halogen-containing compound based acid generators including phenyl-bis(trichloromethyl)-s-triazine; and sulfonic acid based acid generators including benzoin tosylate and N-hydroxysuccinimide trifluoromethanesulfonate.

These acid compounds are contained in an amount of 0.02 to 10% by mass and preferably 0.04 to 5% by mass based on 100% by mass of the total solid content of the composition for forming an EUV resist overlayer film of the present invention.

The composition for forming an EUV resist overlayer film of the present invention may further include a rheology control agent, an adhesion assistant, a surfactant, or other additives as necessary in addition to the above components.

The rheology control agent is added mainly in order to improve flowability of the composition for forming a resist overlayer film. Specific examples of the rheology control agent include phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate.

These rheology control agents are commonly contained in a ratio of less than 30% by mass with respect to 100% by mass of the total composition of the composition for forming an EUV resist overlayer film.

The composition for forming an EUV resist overlayer film of the present invention may further include a surfactant in order not to generate pinholes, striations, and other defects and to further improve the coating properties against surface irregularities. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including EFTOP EF301, EF303, and EF352 (manufactured by Tochem Products (at present: Mitsubishi Materials Electronic Chemicals Co., Ltd.)), MEGAFAC F171 and F173 (manufactured by DIC Corporation), Fluorad FC430 and FC431 (manufactured by Sumitomo 3M Ltd.), Asahiguard AG710, and Surflon S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.).

These surfactants are commonly contained in an amount of 0.2% by mass or less and preferably 0.1% by mass or less based on 100% by mass of the total composition of the composition for forming a resist overlayer film of the present invention. These surfactants may be added singly or in combination of two or more of them.

An EUV resist that is applied underneath the EUV resist overlayer film of the present invention may be positive or negative. Examples of the EUV resist include a chemically amplified resist including an acid generator and a binder having a group that is degraded by an acid to change an alkali dissolution rate, a chemically amplified resist including an alkali soluble binder, an acid generator, and a low molecular compound that is degraded by an acid to change an alkali dissolution rate of a resist, a chemically amplified resist including an acid generator, a binder having a group that is degraded by an acid to change an alkali dissolution rate, and a low molecular compound that is degraded by an acid to change an alkali dissolution rate of a resist, a non-chemically amplified resist including a binder having a group that is degraded by EUV light to change an alkali dissolution rate, and a non-chemically amplified resist including a binder having a moiety that is cleaved by EUV light to change an alkali dissolution rate.

Usable examples of the developer for a positive type resist having a resist overlayer film formed using the composition for forming an EUV resist overlayer film of the present invention include aqueous solutions of alkalis including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. The aqueous solutions of alkalis may contain alcohols such as isopropyl alcohol or a surfactant such as a nonionic surfactant in an appropriate amount to be used as the developer. Among these developers, quaternary ammonium salts are preferred, and tetramethylammonium hydroxide and choline are more preferred.

In the present invention, a semiconductor device can be produced by a process of forming an EUV resist film on a substrate having a film which is to be processed and on which a transfer pattern is formed, with or without an EUV resist underlayer film, a process of applying a composition for forming an EUV resist overlayer film onto the resist film and baking the composition to form an EUV resist overlayer film, a process of exposing the semiconductor substrate coated with the resist overlayer film and the resist film, and a process of developing the substrate after the exposure to remove the resist overlayer film and the resist film. The present invention encompasses the method for producing a semiconductor device including these processes.

Here, the exposure is carried out with EUV (having a wavelength of 13.5 nm) light.

A semiconductor device to which the composition for forming an EUV resist overlayer film of the present invention is applied can have a structure in which, on a substrate, a film to be processed for transferring a pattern, a resist film, and a resist overlayer film in this order during the production process. A resist overlayer film formed from the composition for forming an EUV resist overlayer film of the present invention can reduce adverse effects caused by an underlying substrate or EUV, can form a good straight resist pattern after the exposure of EUV light, and can achieve a margin to a sufficient EUV irradiation amount. A resist overlayer film formed from the composition for forming an EUV resist overlayer film of the present invention can have a large wet etching rate almost equal to that of a resist film formed underneath the overlayer film, thereby a resist pattern can be easily transferred to an underlying film to be processed (a film which is to be processed and to which a pattern is transferred) through a wet etching process.

EXAMPLES

Example 1

In 99 g of 4-methyl-2-pentanol, 1 g of naphthol novolac resin (1-Naphthol and phenol in a molar ratio of 50:50 were reacted with formaldehyde and a novolac resin was synthesized. The resin corresponds to a resin including the structural unit of Formula (7-2). The resin has a weight average molecular weight of 3,200) was dissolved to afford a composition (solution) for forming an EUV resist overlayer film.

Example 2

In 99 g of 4-methyl-2-pentanol, 1 g of naphthol novolac resin (1-Naphthol and phenol in a molar ratio of 70:30 were reacted with formaldehyde and a novolac resin was synthesized. The resin corresponds to a resin including the structural unit of Formula (7-2). The resin has a weight average molecular weight of 2,800) was dissolved to afford a composition (solution) for forming an EUV resist overlayer film.

Example 3

In 99 g of 4-methyl-2-pentanol, 1 g of vinylnaphthalene-containing resin (2-Vinylnaphthalene, hydroxystyrene, and methacrylic acid in a mass ratio of 50:20:30 were radical polymerized. The resin corresponds to a resin including the structural unit of Formula (8-4). The resin has a weight average molecular weight of 5,800) was dissolved to afford a composition (solution) for forming an EUV resist overlayer film.

Comparative Example 1

In 99 g of 4-methyl-2-pentanol, 1 g of polyhydroxystyrene resin (a commercial product, with a weight average molecular weight of 8,000) was dissolved to afford a composition (solution) for forming an EUV resist overlayer film.

[Intermixing Test with Resist]

An EUV resist solution (methacrylic resist) was applied onto a substrate with a spinner. The substrate was heated on a hot plate at 100° C. for 1 minute to form a resist film, and the film thickness was determined (film thickness A: resist film thickness).

Each composition (solution) for forming a resist overlayer film prepared in Example 1 to Example 3 of the present invention and Comparative Example 1 was applied onto the resist film with a spinner, then the coating was heated on a hot plate at 100° C. for 1 minute to form a resist overlayer film, and the film thickness was determined (film thickness B: the sum of the film thicknesses of the resist and the resist overlayer film).

Onto the resist overlayer film, a commercially available developer (manufactured by Tokyo Ohka Kogyo Co., Ltd., product name: NMD-3) was applied, and the substrate was left for 60 seconds. Then, the substrate was rinsed with pure water for 30 seconds while being rotated at 3,000 rpm. After the rinse, the substrate was baked at 100° C. for 60 seconds, and the film thickness was determined (film thickness C). Table 1 shows the obtained results.

A substrate having a film thickness A equal to a film thickness C is evaluated that no intermixing with resist is caused.

TABLE 1

Film thickness determination

|  | Film thickness A (nm) | Film thickness B (nm) | Film thickness C (nm) |
|---|---|---|---|
| Example 1 | 56 | 76 | 56 |
| Example 2 | 56 | 76 | 56 |
| Example 3 | 56 | 76 | 56 |
| Comparative Example 1 | 56 | 76 | 56 |

As listed in Table 1, in each of Example 1 to Example 3 and Comparative Example 1, the film thickness A is equal to the film thickness C, and the obtained results reveal that the film formed using each composition for forming an EUV resist overlayer film causes no intermixing with a resist.

[Optical Parameter Test]

Each of the compositions (solutions) for forming a resist overlayer film prepared in Example 1 to Example 3 of the present invention and the composition (solution) for forming a resist overlayer film in Comparative Example 1 was applied onto a quartz substrate with a spinner. The substrate was heated on a hot plate at 100° C. for 1 minute and a resist overlayer film (a film thickness of 0.03 μm) was formed. Then, each transmittance in a wavelength range from 190 am to 240 nm of four resist overlayer films was measured using a spectrophotometer. FIG. 1 shows the measurement results.

As for the light blocking performance of DUV light, a resist overlayer film having a maximum transmittance of 60% or more in a wavelength range from 200 nm to 240 nm was evaluated as poor and a resist overlayer film having a maximum transmittance of less than 60% was evaluated as good, Table 2 shows the obtained results.

As for the permeability of EUV light (13.5 nm), the transmittance at a wavelength of 13.5 nm was calculated by simulation based on the relation between elemental ratio and film density. A resist overlayer film having a transmittance of 80% or more at a wavelength of 13.5 am was evaluated as good and a resist overlayer film having a transmittance of less than 80% was evaluated as poor. Table 2 shows the obtained results. In Example 1 to Example 3 and Comparative Example 1, each transmittance at 13.5 nm was 88(%).

TABLE 2

EUV permeability and DUV light blocking performance

|  | Film thickness (nm) | Permeability of EUV light | Light blocking performance of DUV light |
|---|---|---|---|
| Example 1 | 30 | good | good |
| Example 2 | 30 | good | good |
| Example 3 | 30 | good | good |
| Comparative Example 1 | 30 | good | poor |

As listed in Table 2, in Example 1 to Example 3, the results show that the permeability of EUV light was good and the light blocking performance of DUV light was excellent. Whereas, in Comparative Example 1, the obtained result reveals that the light blocking performance of DUV light was poor.

In further detail, as shown in FIG. 1, the film formed using each composition for forming a resist overlayer film of Example 1 to Example 3 had a light transmittance of less than 40% in a wavelength range from 220 nm to 240 nm. In particular, the film formed using each composition for forming a resist overlayer film of Example 1 and Example 2 had a light transmittance of less than 40% over a wavelength range from 200 nm to 240 nm, which shows especially good result on the light blocking performance of DUV light.

INDUSTRIAL APPLICABILITY

The composition is for forming an EUV resist overlayer film that is used in an EUV lithography process, and does not intermix with an EUV resist, blocks unfavorable exposure light for EUV exposure, for example, UV and DUV and selectively transmits EUV alone, and can be developed with a developer after exposure.

The invention claimed is:

1. A method for producing a semiconductor device, the method comprising:

forming an EUV resist film on a substrate;

applying an EUV resist overlayer coating composition onto the resist film and baking the composition to form an EUV resist overlayer film, the EUV resist overlayer coating composition comprising:

a resin containing a naphthalene ring in a main chain or in a side chain; and an alcoholic solvent for preventing intermixing with the EUV resist film, the alcoholic solvent being one or more selected from the group consisting of 1-butanol, 2-butanol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol;

exposing the substrate coated with the resist overlayer film and the resist film such that the EUV resist overlayer film blocks UV light and DUV light, which are unfavorable exposure light for EUV exposure, and selectively transmits EUV light alone, the EUV resist overlayer film having a transmittance of DUV light of less than 60% in a wavelength range of from 200 nm to 240 nm and a transmittance of EUV light of 80% or more when a film thickness of the resist overlayer film is 30 nm; and developing the substrate after the exposure to remove the resist overlayer film and the resist film with a developer, wherein the resin includes a unit structure of Formula (1) or unit structures of Formula (1) and Formula (2):

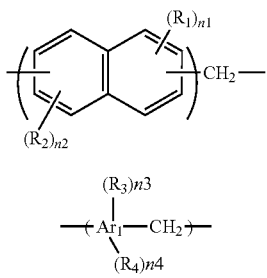

Formula (1)

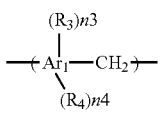

Formula (2)

where:
each of $R_1$ and $R_3$ is independently a hydroxy group, a carboxy group, a sulfo group, or a monovalent organic group comprising at least one selected from the group consisting of a hydroxy group, a carboxy group, and a sulfo group;

each of $R_2$ and $R_4$ is independently a $C_{1-10}$ alkyl group, a $C_{2-10}$ alkenyl group, a benzyl group, a phenyl group, a halogen atom, a $C_{1-10}$ alkoxy group, a nitro group, a cyano group, a $C_{1-10}$ alkylthio group, or a combination of two or more thereof;

$Ar_1$ is a benzene ring or an anthracene ring;

each of n1 and n2 is independently an integer of 0 to 6; and each of n3 and n4 is independently an integer of 0 to a maximum number of substituents capable of being present on the benzene ring or the anthracene ring with a proviso that n1 or n1+n3 is at least 1.

2. The method according to claim 1, wherein the EUV resist overlayer coating composition further comprises an acid compound.

3. The method according to claim 2, wherein the acid compound is a sulfonic acid compound or a sulfonate ester compound.

4. The method according to claim 2, wherein the acid compound is an iodonium salt based acid generator or a sulfonium salt based acid generator.

5. The method according to claim 2, wherein the acid compound is present in an amount of from 0.04 to 5% by mass based on 100% by mass of a total solid content of the composition.

6. The method according to claim 2, wherein the acid compound is bis(4-tert-butylphenyl)iodonium trifluoromethanesulfonate or triphenylsulfonium trifluoromethanesulfonate.

7. The method according to claim 1, wherein the EUV resist overlayer coating composition is applied on the EUV resist film that is arranged on the substrate such that the EUV resist film is between the EUV resist overlayer coating composition and the substrate.

8. The method according to claim 1, wherein the EUV resist overlayer film is arranged on the EUV resist film that is arranged on the substrate during the exposure such that the EUV resist film is between the EUV resist overlayer film and the substrate.

9. The method according to claim 1, wherein the alcoholic solvent is one or more selected from the group consisting of 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

10. The method according to claim 1, wherein the alcoholic solvent is one or more selected from the group consisting of 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, and 4-methyl-3-pentanol.

11. The method according to claim 1, wherein the EUV resist overlayer coating composition comprises a solid content in a range of from 0.1 to 50% by mass.

12. The method according to claim 1, wherein the developer is alkaline.

13. The method according to claim 1, wherein the exposing is further carried out by irradiating light having a wavelength of 300 nm or less in an amount of about 5% in addition to the EUV light.

\* \* \* \* \*